(12) United States Patent
Cheng et al.

(10) Patent No.: US 10,444,780 B1
(45) Date of Patent: Oct. 15, 2019

(54) REGULATION/BYPASS AUTOMATION FOR LDO WITH MULTIPLE SUPPLY VOLTAGES

(71) Applicant: QUALCOMM Incorporated, San Diego, CA (US)

(72) Inventors: Yueh Chun Cheng, Cupertino, CA (US); Hung-Min Cheng, Saratoga, CA (US); Chien-Chih Lin, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/136,305

(22) Filed: Sep. 20, 2018

(51) Int. Cl.
G05F 1/575 (2006.01)
H03F 3/45 (2006.01)

(52) U.S. Cl.
CPC ......... *G05F 1/575* (2013.01); *H03F 3/45179* (2013.01)

(58) Field of Classification Search
CPC ... G05F 1/56; G05F 1/575; G05F 1/59; G05F 1/595; H03F 3/45; H03F 3/45179
See application file for complete search history.

(56) References Cited

U.S. PATENT DOCUMENTS

| | | | |
|---|---|---|---|
| 5,631,598 A | 5/1997 | Miranda et al. | |
| 6,046,577 A | 4/2000 | Rincon-Mora et al. | |
| 6,147,550 A | 11/2000 | Holloway | |
| 6,188,211 B1 | 2/2001 | Rincon-Mora et al. | |
| 6,188,212 B1 | 2/2001 | Larson et al. | |
| 6,359,427 B1 | 3/2002 | Edwards et al. | |
| 6,522,111 B2 | 2/2003 | Zadeh et al. | |
| 6,586,917 B1 | 7/2003 | Smith | |
| 6,617,832 B1 | 9/2003 | Kobayashi | |
| 6,791,390 B2 | 9/2004 | Gay | |
| 6,856,124 B2 | 2/2005 | Dearn et al. | |

(Continued)

FOREIGN PATENT DOCUMENTS

CN 1175018 A 3/1998
CN 101419477 A 4/2009
(Continued)

OTHER PUBLICATIONS

Akhamal H., et al., "Fast Transient Response Low Drop-out Voltage Regulator," International Journal of Embedded Systems and Applications (IJESA), Sep. 2014, vol. 4, No. 2/3, pp. 1-10.
(Continued)

*Primary Examiner* — Matthew V Nguyen
(74) *Attorney, Agent, or Firm* — Qualcomm Incorporated

(57) ABSTRACT

Regulation/Bypass automation for a low drop-out regulator (LDO) with multiple supply voltages is disclosed. In some implementations, a LDO includes a resistor, a pass transistor having a source, a gate, and a drain to output a voltage Vout, the source coupled to a supply voltage, the gate coupled to an output of an operational transconductance amplifier (OTA), and the drain coupled to a first terminal of the resistor; a feedback switch having a drain, a gate, and a source, the drain coupled to a second terminal of the resistor, the source coupled to a negative input of the OTA; and an pull-down transistor having a drain, a gate, and a source, the source coupled to ground, and the drain coupled to the negative input of the OTA, wherein the gate of the pull-down transistor and the gate of the feedback switch are configured to receive a bypass signal.

10 Claims, 8 Drawing Sheets

(56) References Cited

U.S. PATENT DOCUMENTS

| | | | |
|---|---|---|---|
| 7,109,690 B2* | 9/2006 | Ke | G05F 1/575 323/273 |
| 7,148,670 B2 | 12/2006 | Inn et al. | |
| 7,492,137 B2 | 2/2009 | Yamada | |
| 7,504,814 B2 | 3/2009 | Lee et al. | |
| 7,548,051 B1 | 6/2009 | Tenbroek et al. | |
| 7,710,090 B1 | 5/2010 | Kimura | |
| 8,072,196 B1* | 12/2011 | Li | G05F 1/56 323/266 |
| 8,248,150 B2 | 8/2012 | Tadeparthy et al. | |
| 8,294,441 B2 | 10/2012 | Gurcan et al. | |
| 8,841,893 B2 | 9/2014 | Bulzacchelli et al. | |
| 9,223,329 B2 | 12/2015 | Pulvirenti et al. | |
| 9,274,534 B2 | 3/2016 | Fang et al. | |
| 9,377,798 B2 | 6/2016 | Bhattad | |
| 9,543,826 B2 | 1/2017 | Chen et al. | |
| 9,588,541 B1 | 3/2017 | Ho et al. | |
| 9,608,522 B2 | 3/2017 | Lin et al. | |
| 9,684,325 B1 | 6/2017 | Rasmus | |
| 9,740,225 B1 | 8/2017 | Wong | |
| 9,778,672 B1 | 10/2017 | Gao et al. | |
| 9,946,283 B1 | 4/2018 | Yung et al. | |
| 10,013,005 B1 | 7/2018 | Ippili | |
| 2004/0027097 A1 | 2/2004 | Denicholas et al. | |
| 2004/0140845 A1 | 7/2004 | Eberlein | |
| 2005/0189930 A1 | 9/2005 | Wu et al. | |
| 2005/0206444 A1 | 9/2005 | Perez et al. | |
| 2005/0248331 A1 | 11/2005 | Whittaker et al. | |
| 2006/0164053 A1 | 7/2006 | Walter et al. | |
| 2006/0181258 A1 | 8/2006 | Benbrik | |
| 2007/0057655 A1 | 3/2007 | Nishida | |
| 2007/0139030 A1 | 6/2007 | Lee et al. | |
| 2007/0242536 A1 | 10/2007 | Matsubara | |
| 2008/0211467 A1 | 9/2008 | Huang et al. | |
| 2008/0278127 A1 | 11/2008 | Nagata | |
| 2008/0303496 A1 | 12/2008 | Schlueter et al. | |
| 2009/0010035 A1 | 1/2009 | Williams | |
| 2009/0179622 A1* | 7/2009 | Ivanov | G05F 1/575 323/271 |
| 2009/0189591 A1 | 7/2009 | Sperling et al. | |
| 2009/0243568 A1 | 10/2009 | Nguyen | |
| 2009/0322429 A1 | 12/2009 | Ivanov et al. | |
| 2010/0213917 A1 | 8/2010 | Pulijala et al. | |
| 2010/0327959 A1 | 12/2010 | Lee | |
| 2011/0089916 A1 | 4/2011 | Soenen et al. | |
| 2012/0112718 A1 | 5/2012 | Pons | |
| 2012/0187897 A1 | 7/2012 | Lenk et al. | |
| 2012/0229111 A1 | 9/2012 | Serdarevic | |
| 2013/0082671 A1* | 4/2013 | Ivanov | G05F 1/563 323/274 |
| 2013/0099764 A1 | 4/2013 | Zhang et al. | |
| 2013/0113447 A1* | 5/2013 | Kadanka | G05F 1/56 323/280 |
| 2013/0221940 A1 | 8/2013 | Yan et al. | |
| 2014/0042998 A1 | 2/2014 | Saito et al. | |
| 2014/0084896 A1 | 3/2014 | Zhang et al. | |
| 2014/0139198 A1 | 5/2014 | Manlove et al. | |
| 2014/0266103 A1 | 9/2014 | Wang et al. | |
| 2014/0277812 A1 | 9/2014 | Shih et al. | |
| 2014/0306676 A1 | 10/2014 | Hu et al. | |
| 2015/0028828 A1 | 1/2015 | Chen | |
| 2015/0103566 A1 | 4/2015 | Keogh et al. | |
| 2015/0115830 A1 | 4/2015 | Siessegger | |
| 2015/0130434 A1 | 5/2015 | Jain et al. | |
| 2015/0137780 A1 | 5/2015 | Lerner et al. | |
| 2015/0160668 A1 | 6/2015 | Pujol et al. | |
| 2015/0168969 A1 | 6/2015 | Shor | |
| 2015/0192943 A1 | 7/2015 | Roham et al. | |
| 2015/0198959 A1 | 7/2015 | Kuttner | |
| 2015/0198960 A1 | 7/2015 | Zhang et al. | |
| 2015/0220096 A1* | 8/2015 | Luff | G02F 1/1368 327/109 |
| 2015/0349622 A1 | 12/2015 | Lo et al. | |
| 2015/0362936 A1* | 12/2015 | Patel | G05F 1/575 323/280 |
| 2016/0124448 A1 | 5/2016 | Murukumpet et al. | |
| 2016/0349776 A1 | 12/2016 | Conte et al. | |
| 2017/0052552 A1 | 2/2017 | Mahmoudi et al. | |
| 2017/0117803 A1 | 4/2017 | Matsuki et al. | |
| 2017/0205841 A1 | 7/2017 | Jefremow et al. | |
| 2017/0212540 A1 | 7/2017 | Cho et al. | |
| 2017/0220059 A1 | 8/2017 | Kadowaki | |
| 2017/0322575 A1 | 11/2017 | Du et al. | |
| 2017/0364110 A1 | 12/2017 | Golara et al. | |
| 2017/0371365 A1 | 12/2017 | Kossel | |
| 2018/0217623 A1 | 8/2018 | Bhattad et al. | |
| 2019/0146532 A1 | 5/2019 | Ballarin et al. | |

FOREIGN PATENT DOCUMENTS

| | | |
|---|---|---|
| CN | 108445950 A | 8/2018 |
| EP | 1253498 A1 | 10/2002 |
| WO | 2014042726 A1 | 3/2014 |

OTHER PUBLICATIONS

Alon E., et al., "Replica Compensated Linear Regulators for Supply-Regulated Phase-Locked Loops," IEEE Journal of Solid-State Circuits, vol. 41, No. 2, Feb. 2006, pp. 413-424.

Assi A., et al., "A Fully Differential and Tunable CMOS Current Mode opamp Based on Transimpedance-Transconductance Technique", Circuits and Systems, 1997. Proceedings of the 40th Midwest Symposium on Sacramento, CA, USA Aug. 3-6, 1997, New York, NY, USA, IEEE, US, vol. 1, Aug. 3, 1997 (Aug. 3, 1997), pp. 168-171, XP010272437, DOI: 10.1109/MWSCAS.1997. 666060, ISBN: 978-0-7803-3694-0.

Bontempo G., et al., "Low Supply Voltage, Low Quiescent Current, ULDO Linear Regulator," The 8th IEEE International Conference on Electronics, Circuits and Systems 2001, pp. 409-412.

Bulzacchelli J.F., et al., "Dual-Loop System of Distributed Microregulators With High DC Accuracy, Load Response Time Below 500 ps, and 85-mV Dropout Voltage," IEEE Journal of Solid-State Circuits, vol. 47, No. 4, Apr. 2012, pp. 863-874.

Camacho D., et al., "An NMOS Low Dropout Voltage Regulator with Switched Floating Capacitor Gate Overdrive," Department of Electrical Engineering, Southern Methodist University, Dallas, Texas, USA, 52nd IEEE International Midwest Symposium on Circuits and Systems, Aug. 2009, pp. 808-811.

Den Besten G.W., et al., "Embedded 5 V-to-3.3 V Voltage Regulator for Supplying Digital IC's in 3.3 V CMOS Technology," IEEE Journal of Solid-State Circuits, vol. 33, No. 7, Jul. 1998, pp. 956-962.

Gupta V., et al., "A Low Dropout, CMOS Regulator with High PSR over Wideband Frequencies", IEEE International Symposium on Circuits and Systems, May 2005, pp. 4245-4248.

Hazucha P., et al., "Area-Efficient Linear Regulator With Ultra-Fast Load Regulation", IEEE Journal of Solid-State Circuits, vol. 40, No. 4, Apr. 2005, pp. 933-940.

Huang H.Y., et al., "A Wideband CMOS Transconductance-Transimpedance Amplifier", Midwest Symposium on Circuits and Systems. Cairo, Egypt, Dec. 27-30, 2003; [Midwest Symposium on Circuits and Systems], Piscataway, NJ, IEEE, US, vol. 1, Dec. 27, 2003 (Dec. 27, 2003), pp. 153-156, XP010867413, DOI: 10.1109/MWSCAS.2003.1562241, ISBN: 978-0-7803-8294-7.

Lu Y., et al., "A 0.65ns-Response-Time 3.01ps FOM Fully-Integrated Low-Dropout Regulator with Full-Spectrum Power-Supply—Rejection for Wideband Communication Systems," IEEE International Solid-State Circuits Conference, Technical Papers, Feb. 2014, pp. 306-307. Retrieved from the Internet: URL:http://www.researchgate.net/publication/271550565.

Milliken R.J., et al., "Full on-chip CMOS low-dropout voltage regulator", IEEE Transactions on Circuits and Systems I: Fundamental Theory and Applications, vol. 54, No. 9, Sep. 2007, pp. 1879-1890.

(56) References Cited

OTHER PUBLICATIONS

Rincon-Mora G.A., et al., "A Low-Voltage, Low Quiescent Current, Low Drop-Out Regulator," IEEE Journal of Solid-State Circuits, Jan. 1998, vol. 33, No. 1, pp. 36-44.
Teel J.C., "Understanding power supply ripple rejection in linear regulators", Analog Applications Journal, Analog and Mixed-Signal Products, 2005, 4 Pages.

* cited by examiner

REGULATION/BYPASS AUTOMATION FOR LDO WITH MULTIPLE SUPPLY VOLTAGES

FIELD OF DISCLOSURE

Aspects of the present disclosure relate generally to power regulation in semiconductor circuits, and more particularly to regulation/bypass automation for low drop-out regulator (LDO) with multiple supply voltages.

BACKGROUND

As semiconductor technology advances, many systems on a chip (SoCs) can operate at lower voltage supply (e.g., 1.8V), resulting in lower overall power consumption. However, the need to support legacy devices that operate at higher voltage supplies (e.g., 5V, 3.3V, etc.) remains. Therefore, there is a need in the art to provide a more flexible and efficient LDO to allow advance process SoCs to support legacy devices.

SUMMARY OF THE DISCLOSURE

The following presents a simplified summary of one or more embodiments in order to provide a basic understanding of such implementations. This summary is not an extensive overview of all contemplated implementations, and is intended to neither identify key or critical elements of all embodiments nor delineate the scope of any or all implementations. The sole purpose of this summary is to present some concepts of one or more embodiments in a simplified form as a prelude to the more detailed description that is presented later.

In some implementations, a low drop-out regulator (LDO) includes a first resistor having a first terminal and a second terminal; and a p-type pass transistor having a source, a gate, and a drain to output a voltage Vout, the source coupled to a supply voltage, the gate coupled to an output of an operational transconductance amplifier (OTA), and the drain coupled to the first terminal of the first resistor. The LDO further includes a p-type feedback switch having a drain, a gate, and a source, the drain coupled to the second terminal of the first resistor, the source coupled to a positive input of the OTA. The LDO further includes an n-type pull-down transistor having a drain, a gate, and a source, the source coupled to ground, the gate coupled to the gate of the p-type feedback transistor, and the drain coupled to the negative input of the OTA, wherein the gate of the n-type pull-down transistor and the gate of the p-type feedback switch are configured to receive a bypass signal.

In some implementations, the LDO further includes a second resistor having a first terminal and a second terminal. The second terminal is coupled to ground and the first terminal is coupled to the second terminal of the first resistor.

In some implementations, the bypass signal is asserted when the supply voltage is at approximately 1.8V. The bypass signal can be de-asserted when the supply voltage is at 3.3V or 5.0 V. The LDO enters a bypass mode when the bypass signal is asserted. On the other hand, the LDO enters a regulation mode when the bypass signal is de-asserted.

In some implementations, the LDO operates in the regulation mode by default when the LDO is powered on.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

System on a chip (SoC) design in advanced technology node needs to interface with multiple input/output (I/O) voltage supplies, including higher voltages in legacy devices. A uniform power-on sequence for various I/O supplies is a must-have feature for power management unit (PMU) to shorten product development time. A regulator, typically, a low drop-out regulator (LDO), is needed to lower the I/O voltage supply when interfacing with legacy products or bypass I/O voltage supply when the I/O voltage supply is about the same as in the SoC. In other words, a normal mode (a.k.a. a regulation mode) and a bypass mode are needed in today's SoC designs as conceptually illustrated in FIG. 1.

Figure 1:
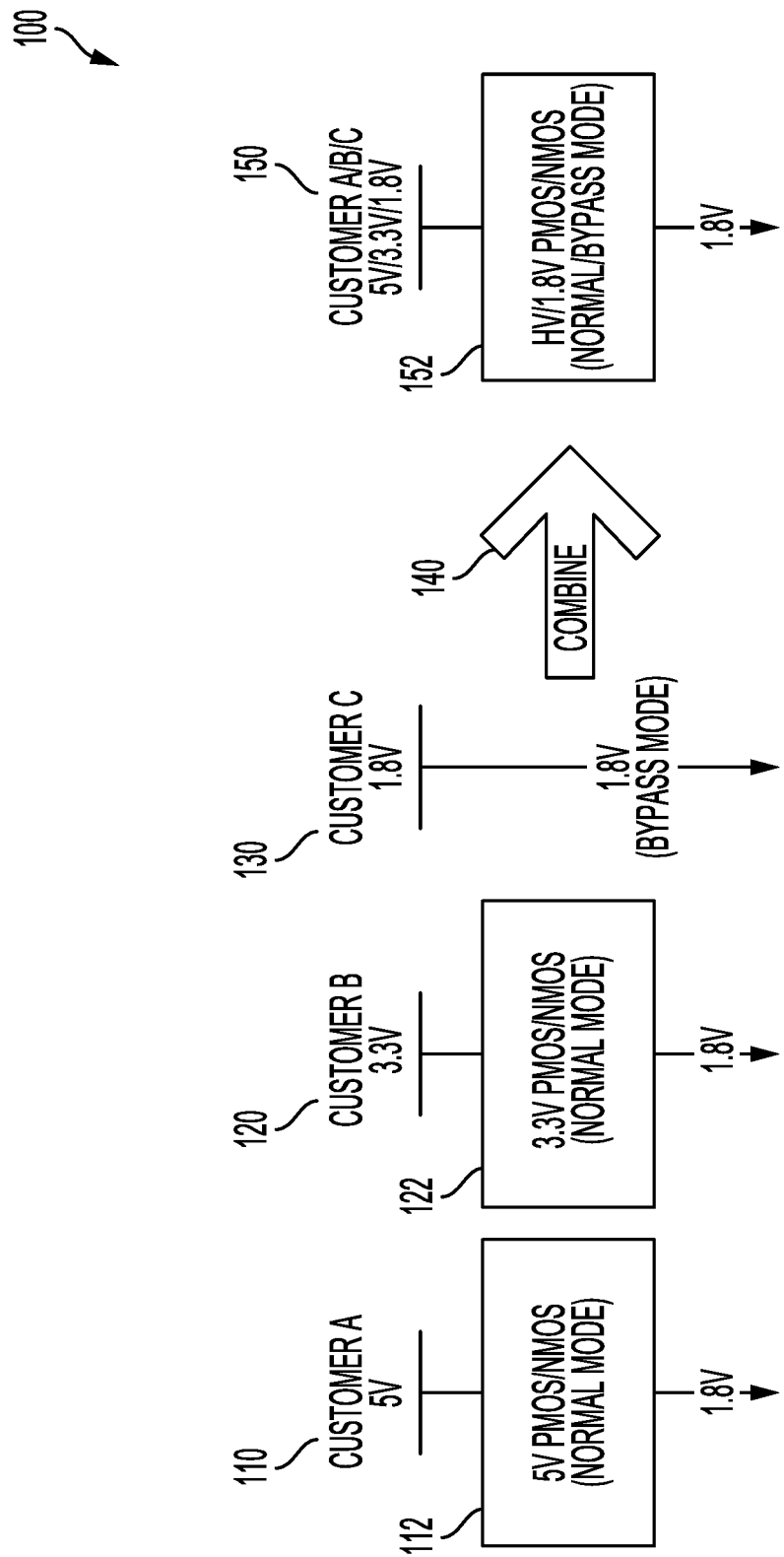
FIG. 1 is a conceptual diagram of one implementation of a low drop-out regulator (LDO) in a system on a chip (SoC).

FIG. 1 is a conceptual diagram of one implementation 100 of a low drop-out regulator (LDO) in a system on a chip (SoC). On the left side of arrow 140, three use cases 110-130 are illustrated. In use case 110, Customer A represents a legacy device that operates at 5 V. In use case 120, Customer B represents another legacy device that operates at 3.3V. In use case 130, Customer C represents a device that operates at 1.8V. In the current example, the SoC operates at 1.8V. Therefore, to support Customer A, the SoC needs a LDO 112 that converts an I/O voltage supply of 5V to 1.8V. Likewise, to support Customer B, the SoC needs a LDO 122 that converts an I/O voltage supply of 3.3V to 1.8V. Because Customer C already operates at 1.8V, which is the same as the SoC, the SoC does not need any voltage regulator to support Customer C. In other words, the SoC can bypass the LDO when supporting Customer C (a.k.a. a bypass mode). To enhance the flexibility and versatility of the SoC, the LDOs 112 and 122, as well as the bypass mode represented in use case 130, are combined into a LDO that supports multiple supply voltages and automatically switches between regulation mode and bypass mode in some implementations.

In some advanced technology nodes, high voltage (HV) devices are used to interface with legacy high I/O supply voltage. Though the drain source voltage (Vds) range of the HV devices is increased, gate source voltage (Vgs) is still limited (e.g., Vgs has to be equal to or below 1.8V in 28 nm node). Internal logic level has to be 1.8V even if I/O supply voltage is at a higher level (e.g., 5 V, 3.3 V), or 1.8V in the example shown in FIG. 1, for reliability reason.

Figure 2:
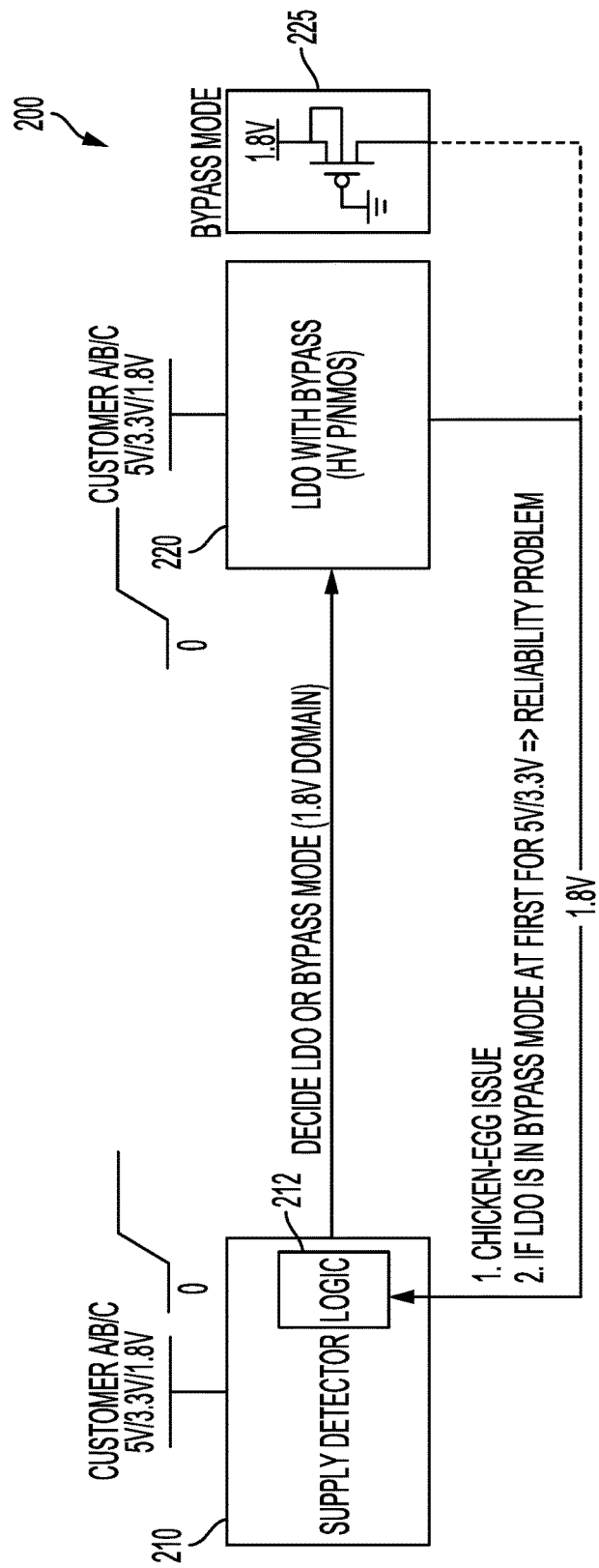
FIG. 2 illustrates a conventional LDO in a SoC.

One conventional SoC design 200 is shown in FIG. 2. A supply detector 210 is used to detect the voltage level of the voltage supply received from a customer device A, B, or C, and then to send out a logic signal to configure LDO 220 in regulation mode or bypass mode (as represented by the diode connected p-type transistor 225) based on the voltage supply detected. However, the logic circuit 212 in the supply detector 210 typically requires a 1.8V voltage supply from the output of LDO 220 in order to be powered up and function correctly. But at boot up, the output of LDO 220 may not be at 1.8V yet. This can cause a chicken-and-egg issue in the power on sequence of the SoC design 200.

Another issue with the SoC design 200 in FIG. 2 is the reliability problem. If LDO 220 is in bypass mode at first for an I/O supply voltage at 5V or 3.3V, Vgs of the diode connected p-type transistor 225 may go beyond 1.8V. Such high Vgs on the transistor 225 may put too much stress on the transistor 225 and results in reliability problem later in the lifetime of the SoC 200. For instance, transistor 225 may eventually break down over a prolonged period of use, leading to malfunctioning of LDO 220.

Figure 3:
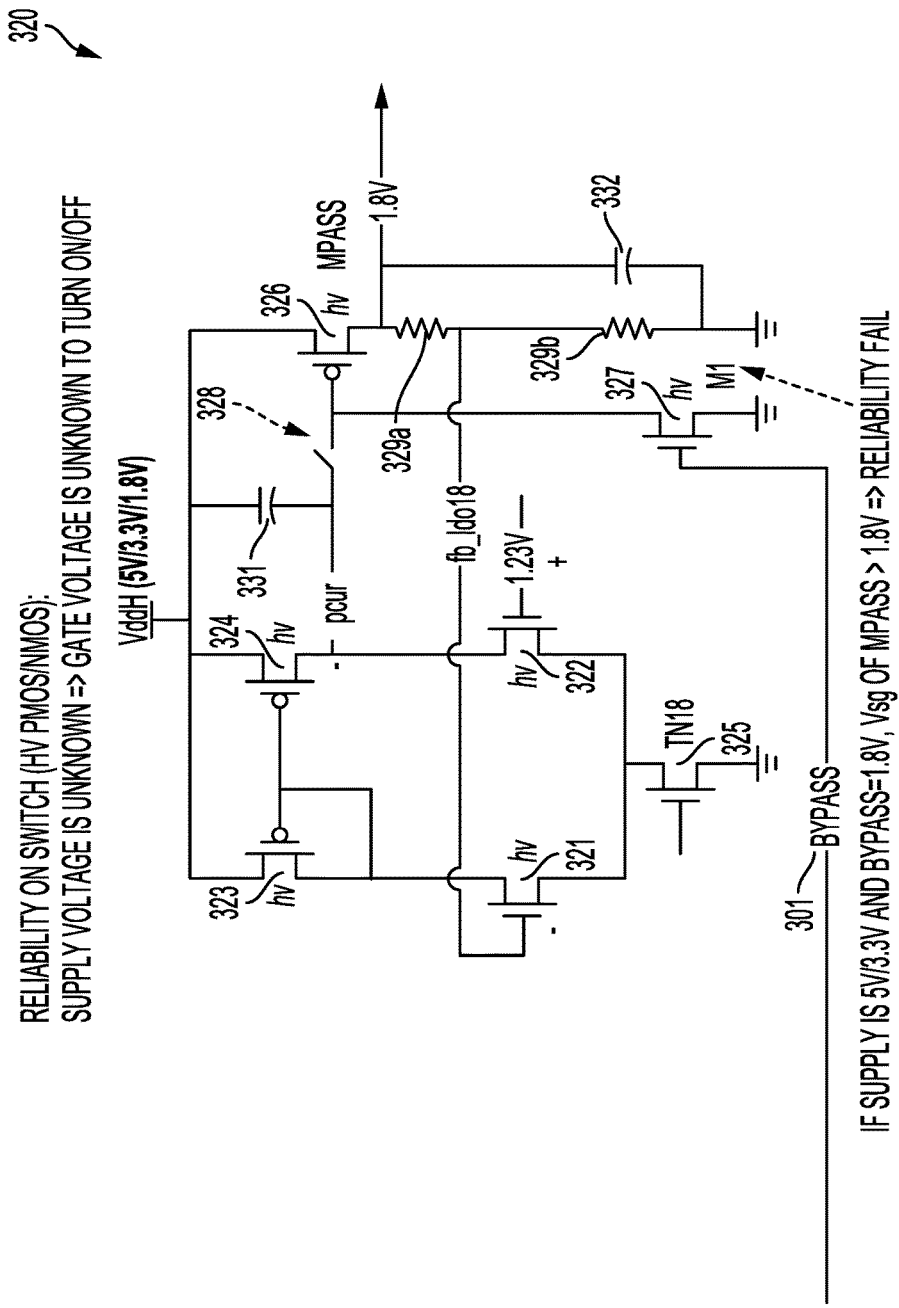
FIG. 3 shows a detailed circuit implementation of one conventional LDO.

FIG. 3 shows a detailed circuit implementation of one conventional LDO 320 used in a SoC. LDO 320 includes a pair of n-type transistors 321 and 322, a bias transistor 325, a pair of p-type transistors 323 and 324, a pass transistor (a.k.a. a pass switch) 326, an n-type transistor 327, a switch 328, a pair of output resistors 329a and 329b, an output capacitor 332 and a capacitor 331. In some implementations, the aforementioned transistors of LDO 320 are all HV devices. Transistors 321 and 322 are configured as negative and positive input transistors, respectively. The source of each of transistors 321 and 322 are coupled to a drain of the bias transistor 325. A source of the bias transistor 325 is coupled to ground. The drains of the input transistors 321 and 322 are coupled to the drains of transistors 323 and 324, respectively. The gates of transistors 323 and 324 and the drain of transistor 323 are coupled together. The sources of transistors 323 and 324 are coupled to a voltage supply VddH from a device external to the SoC. In the case of a legacy device (e.g., Customer A or Customer B in FIG. 1), the voltage supply VddH can be at 5V or 3.3V. In the case of a low power device (e.g., Customer C), the voltage supply VddH can be at 1.8V. Transistor 324 is coupled in parallel to capacitor 331. The drain of transistor 324 is coupled to the gate of pass transistor 326 and the drain of transistor 327. The source of transistor 327 is coupled to ground. The gate of transistor 327 receives a bypass signal 301 from a voltage comparator. The source of the pass transistor 326 is coupled to voltage supply VddH and the drain of the pass transistor 326 is coupled to output resistor 329a and output capacitor 332. Output resistors 329a and 329b are coupled in series between transistor 326 and ground, while output capacitor 332 is coupled in parallel to output resistors 329a and 329b.

Figure 4:
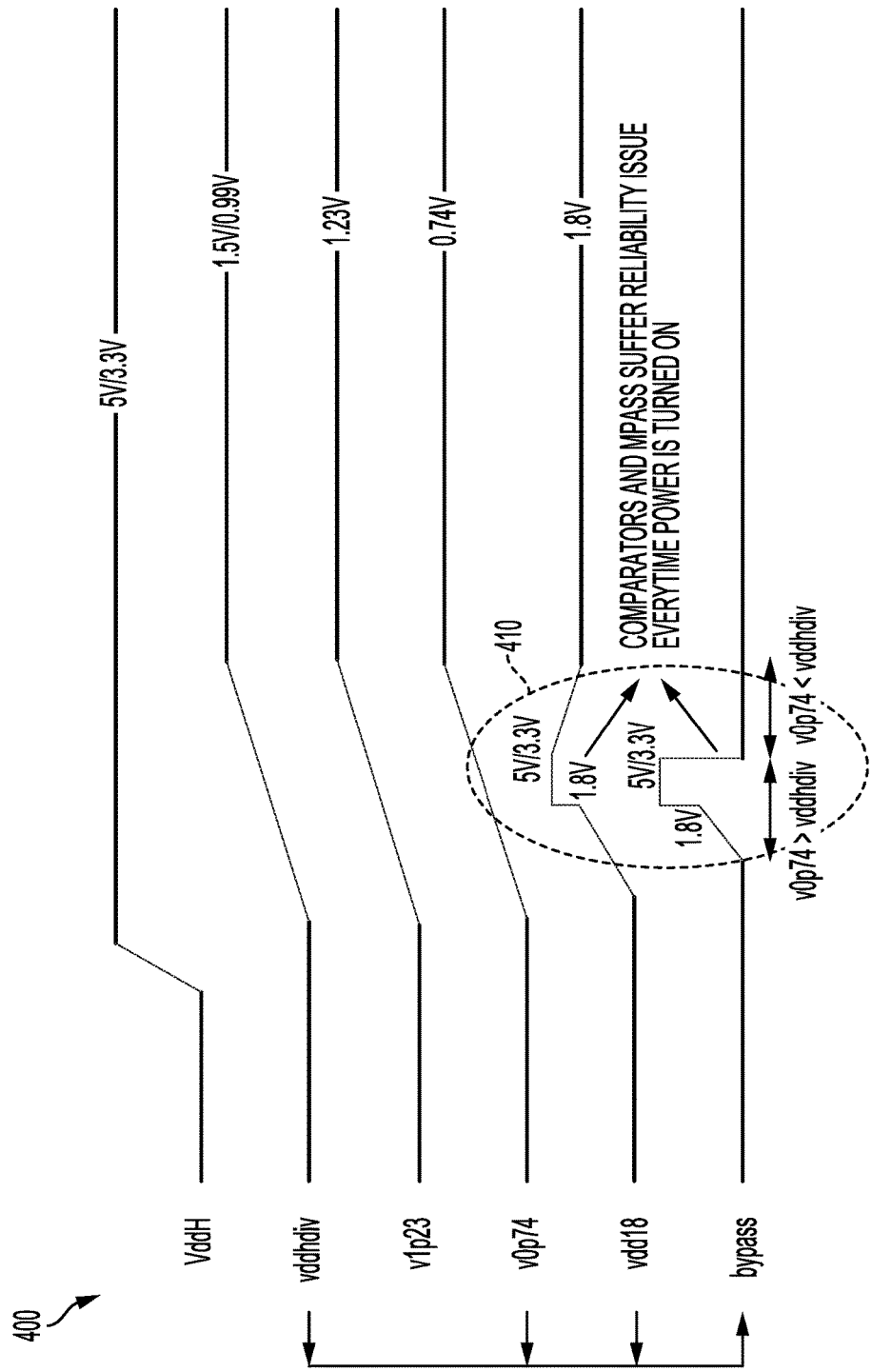
FIG. 4 shows a waveform diagram to illustrate the potential "glitch" at power on that can cause reliability problem.

A switch 328 is coupled between the gate of pass transistor 326 and the drain of transistor 324 to switch between the regulation or bypass modes. However, as discussed above, in advanced process nodes (e.g., 28 nm or beyond), 3.3V/0V voltage cannot be applied to the switch 328 due to reliability concern. FIG. 4 shows a waveform diagram 400 to illustrate the potential "glitch" at power up that can cause reliability problem. As shown n FIG. 4, there is a glitch 410 in the bypass signal and vdd18 during power ramp-up. This glitch 410 can lead to reliability problem in pass transistor 326. Specifically, if supply voltage VddH is at 5V or 3.3V and bypass signal is at 1.8V, then the source gate voltage (Vsg) of pass transistor 326 will exceed 1.8V, leading to reliability fail. Thus, a LDO is needed to address the power-on sequence issue and the reliability issue discussed above. Some implementations of such a novel LDO are disclosed herein.

In some implementations, the LDO can automate regulation or bypass dual mode function for 1.8V I/O voltage delivery during power-on event to support legacy I/O voltages at 5V or 3.3V (e.g., Customers A and B, respectively, in FIG. 1), as well as 1.8V I/O voltage required by many current devices (e.g., Customer C in FIG. 1). The LDO can enter regulation mode with close-loop operation when a bypass signal is at logical "0", and the LDO can enter bypass mode with open-loop option when the bypass signal is at logical "1". In some implementations, the bypass signal is a 1.8V logic signal and it can come from comparators which run at 1.8V from the LDO. In this regard, there is a "chicken-and-egg" problem for the LDO and the comparators to handle the bypass signal. Some implementations of a novel LDO disclosed herein can mitigate this "chicken-and-egg" problem while addressing the reliability and power-up sequence issues discussed above.

Figure 5A:
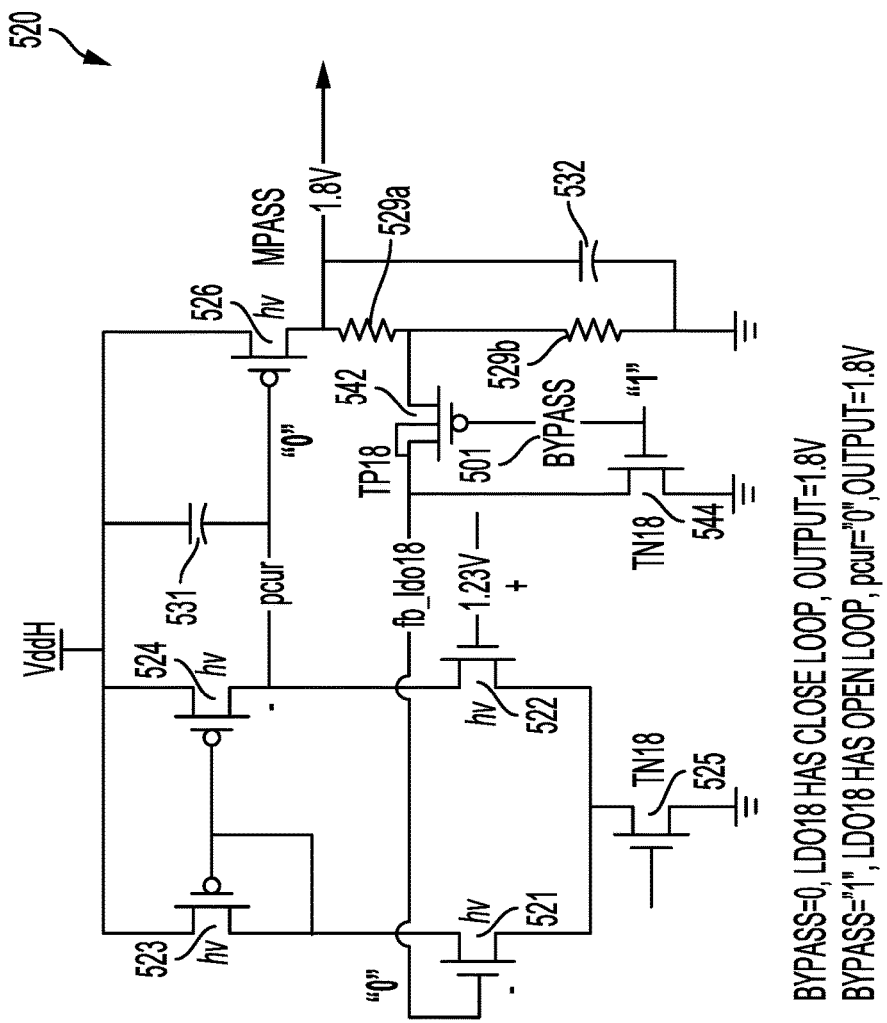
FIG. 5A shows one implementation of a LDO.
Figure 5B:
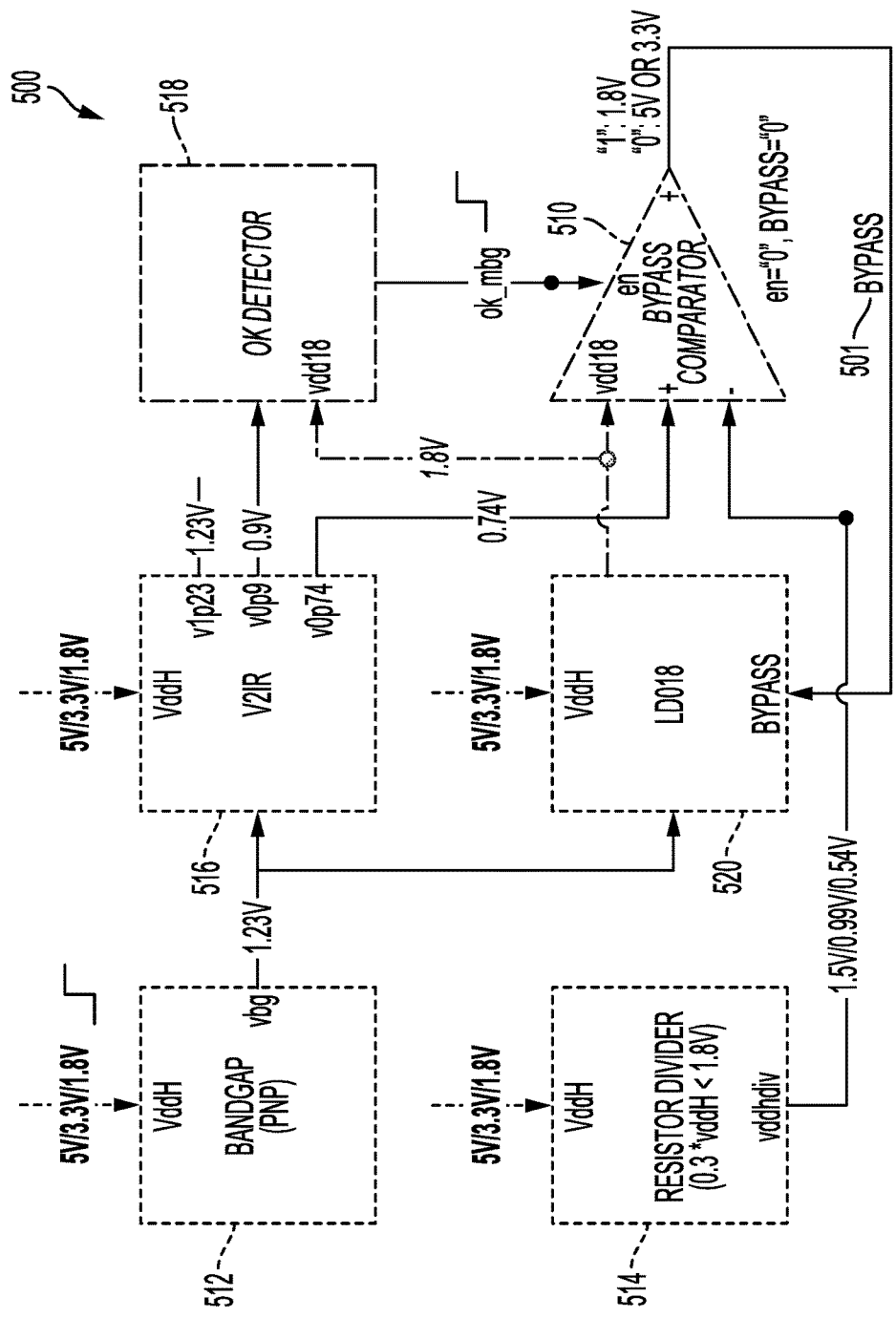
FIG. 5B shows one implementation of a SoC.

FIG. 5A illustrates implementation of the LDO 520 and FIG. 5B illustrates one implementation of a SoC 500 incorporating the LDO 520 in FIG. 5A.

Referring to FIG. 5A, LDO 520 includes a pair of n-type transistors 521 and 522, a bias transistor 525, a pair of p-type transistors 523 and 524, a pass transistor (a.k.a. a pass switch) 526, a pair of output resistors 529a and 529b, an output capacitor 532 and a capacitor 531. In some implementations, the aforementioned transistors of LDO 520 are all HV devices. Transistors 521 and 522 are configured as negative and positive input transistors, respectively. The source of each of transistors 521 and 522 are coupled to a drain of the bias transistor 525. A source of the bias transistor 525 is coupled to ground. The drains of the input transistors 521 and 522 are coupled to the drains of transistors 523 and 524, respectively. The gates of transistors 523 and 524 and the drain of transistor 523 are coupled together. The sources of transistors 523 and 524 are coupled to a voltage supply VddH from a device external to the SoC. In the case of a legacy device (e.g., Customer A or Customer B in FIG. 1), the voltage supply VddH can be at 5V or 3.3V. In the case of a low power device (e.g., Customer C), the voltage supply VddH can be at 1.8V. Transistors 521-525 together are configured as an operational transconductance amplifier (OTA), where the gates of transistors 521 and 522 serve as the negative and positive input terminals, respectively, of the OTA. The drain of transistor 524 can be configured as an output of the OTA.

In some implementations, transistor 524 is coupled in parallel to capacitor 531. The drain of transistor 524 is coupled to the gate of pass transistor 526. The source of pass transistor 526 is coupled to voltage supply VddH and the drain of the pass transistor 526 is coupled to output resistor 529a and output capacitor 532. Output resistors 529a and 529b are coupled in series between pass transistor 526 and ground, while output capacitor 532 is coupled in parallel to output resistors 529a and 529b.

In some implementations, at least two more transistors 542 and 544 are added to the feedback path between output resistor 529a and the gate of transistor 521 (i.e., the negative input terminal of the OTA). Transistor 542 may be referred to as a feedback switch or feedback transistor, whereas transistor 544 may be referred to as a pull-down switch or pull-down transistor. Referring to FIG. 5A, transistor 542 is a p-type transistor having a gate, a source, and a drain. Transistor 544 is an n-type transistor having a gate, a source, and a drain. The gates of both transistor 542 and 544 are coupled together to receive a bypass signal 501. The source of transistor 544 is coupled to ground. The drain of transistor 544 is coupled to the gate of transistor 521. The source and the bulk of transistor 542 are coupled together, which is further coupled to the gate of transistor 521. The drain of transistor 542 is coupled to a node in between output resistor 529a and output resistor 529b.

LDO 520 can go into bypass mode when supply voltage VddH is at 1.8V, or regulation mode when supply voltage VddH is at 5V or 3.3V. In some implementations, LDO 520 is configured into one of the bypass mode or regulation mode in response to bypass signal 501. When bypass signal 501 is at a logical "0", transistor 542 is turned on to close the feedback loop, resulting in an output of 1.8V at the drain of pass transistor 526. Thus, LDO 520 goes into regulation mode. When bypass signal 501 is at a logical "1", transistor 542 is turned off to open (or break) the feedback loop, and transistor 544 is turned on to pull the gate of transistor 521 to ground. Thus, LDO 520 goes into bypass mode.

LDO 520 can work with a number of infrastructural blocks in a SoC to support customer devices requiring different voltage supplies. One implementation of a SoC 500 having LDO 520 and other infrastructural blocks is shown in FIG. 5B. Referring to FIG. 5B, SoC 500 includes a bypass comparator 510, a bandgap reference generator 512, a resistor divider 514, a V-to-IR (V2IR) block 516, an OK detector 518, and LDO 520.

In some implementations, a voltage supply VddH from a customer device external to SoC 500 is input to bandgap reference generator 512, resistor divider 514, V2IR block 516, and LDO 520. As discussed above, the voltage supply can be at 5 V or 3.3V for legacy customer devices, or 1.8V for current customer devices. Bandgap reference generator 512 is configured to output a bandgap voltage vbg at about 1.23V. The signal vbg remains substantially constant at about 1.23V when voltage supply VddH is available. The signal vbg is then input to V2IR 516 and LDO 520. Resistor divider 514 is configured to divide voltage supply VddH received with about 0.3 ratio to produce a signal vddhdiv, which can be at about 1.5V, 0.99V, or 0.54V if VddH is at 5V, 3.3V, or 1.8V, respectively. Using combinations of on-chip resistors within V2IR 516, V2IR 516 is configured to convert vbg into IR currents that translate into three voltage signals, namely, v1p23 at about 1.23V, v0p9 at about 0.9V, and v0p74 at about 0.74V. These three voltage signals are also substantially constant when both VddH and vbg are available. The signal v0p9 is then input to Ok detector 518, and the signal v0p74 is input to a positive input terminal of bypass comparator 510. A negative input terminal of bypass comparator 510 receives vddhdiv from resistor divider 514. Bypass comparator 510 outputs bypass signal 501. LDO 520 also receives vbg (which is at about 1.23V) from bandgap reference generator 512. LDO 520 further receives bypass signal 501 output from bypass comparator 510. As discussed above with reference to FIG. 5A, LDO 520 generates an output voltage vdd18 of about 1.8V. LDO 520 provides the output voltage of 1.8V to both Ok detector 518 and bypass comparator 510. Ok detector 518 detects v0p9 voltage level and asserts an ok_mbg signal, which is input to an enable input terminal of bypass comparator 510. Bypass comparator 510 compares vddhdiv against v0p74 when ok_mbg is asserted and outputs bypass signal 501 accordingly.

Figure 6:
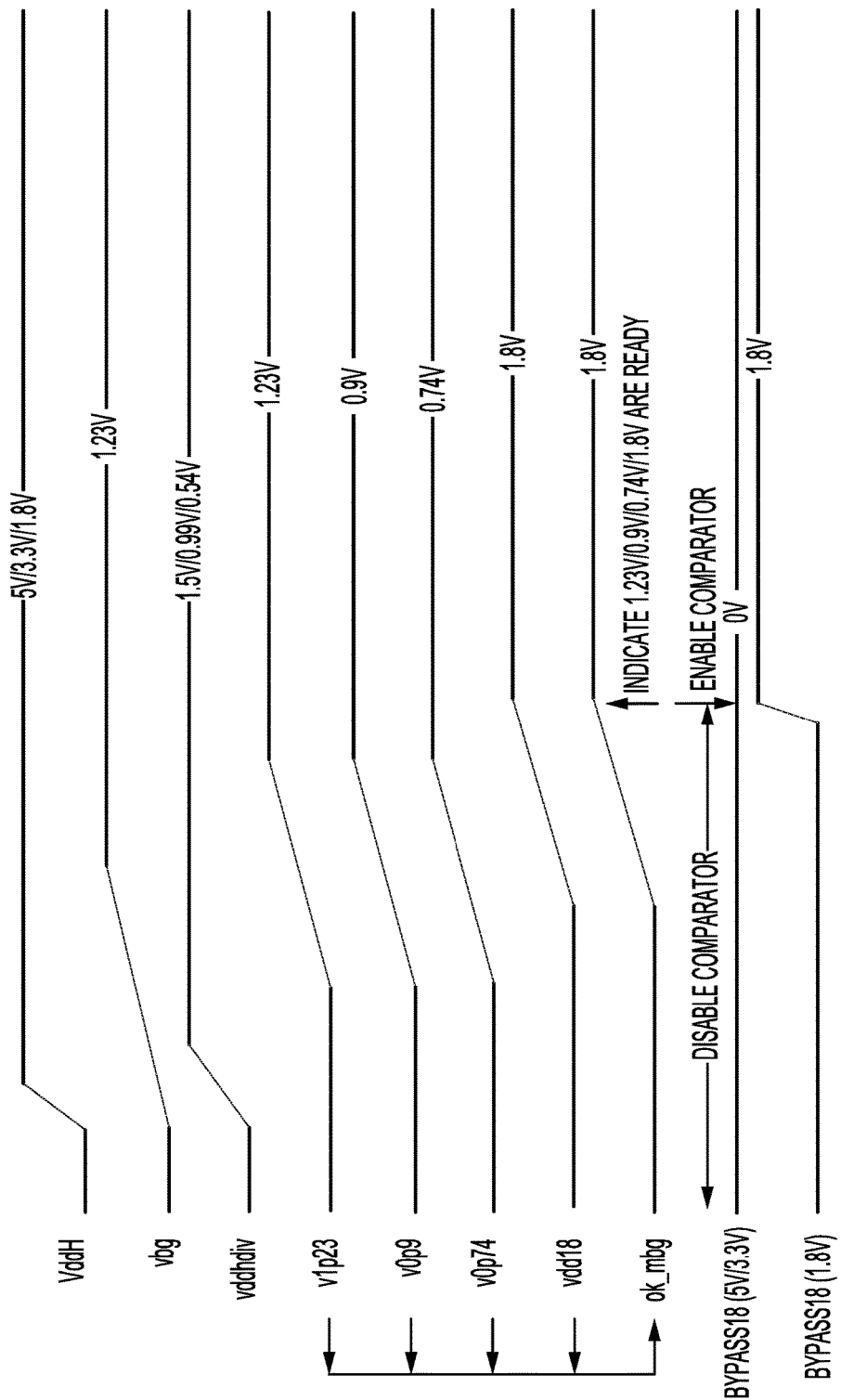
FIG. 6 shows one exemplary power-on sequence of SoC illustrated in FIG. 5B.

One exemplary power-on sequence of SoC 500 is shown in FIG. 6. During cold boot of SoC 500, the external voltage supply VddH ramps up first before the internal voltages are ready for voltage detection or conversion. The default setting for ok_mbg and bypass 501 is at logical "0" and LDO 520 initially operates in the closed-loop mode (i.e., the regulation mode). In other words, the bypass signal 501 is de-asserted initially and LDO 520 operates in the regulation mode by default when LDO 520 is powered on. The bandgap voltage vbg ramps up slowly and the derived internal reference voltages (i.e., v1p23, v0p9, and v0p74 from V2IR 516) come after vbg with similar slow ramp. The output from LDO 520 (i.e., vdd18) keeps track of these three references and vdd18 remains at 1.8V from input vbg. Since ok_mbg is generated by Ok detector 518, which is supplied by vdd18, the voltage level of ok_mbg tracks vdd18. By the time ok_mbg reaches the threshold voltage level of logical "1", the internal voltage references (i.e., v1p23 at 1.23V, v0p9 at 0.9V, and v0p74 at 0.74V) are ramped up and ready, and thus, bypass comparator 510 starts to detect VddH voltage level and take control of the bypass signal 501. At this point, if voltage supply VddH is at 1.8V, bypass signal 501 will be asserted, and the feedback node of LDO 520 (i.e., the node to which the gate of input transistor 521 is coupled to in FIG. 5A) is pulled to ground, i.e., 0V, which breaks the feedback loop and bypasses the 1.8V to the output of LDO 520, i.e., vdd18. On the other hand, if voltage supply VddH is at 3.3V or 5V, bypass signal 501 is de-asserted and LDO 520 keeps regulating 1.8V for the output of LDO 520, i.e., vdd18. This automation can solve the reliability problem of using HV/1.8V devices for legacy customer devices that requires high I/O voltage (e.g., 3.3V or 5V) discussed above.

In addition to solving the reliability problem, the architecture of LDO 520 also provides the following advantages. First, the architecture of LDO 520 is not limited to three external power supply voltages. More threshold voltages can be added in to detect more external power supply voltages. Further, the external power supply voltage range can be wider in some implementations, e.g., 2.1V-5V/1.8V and can generate 1.8V internal power supply if low threshold is set to about 0.59V and the saturation voltage Vdsat of LDO pass transistor (e.g., transistor 526 in FIG. 5A) is at 300 mV. This provides more flexibility to customers. Moreover, the internal power supply voltage is also flexible, as it can be adjusted to be more or less than 1.8V, depending on internal circuit specification.

Figure 7:
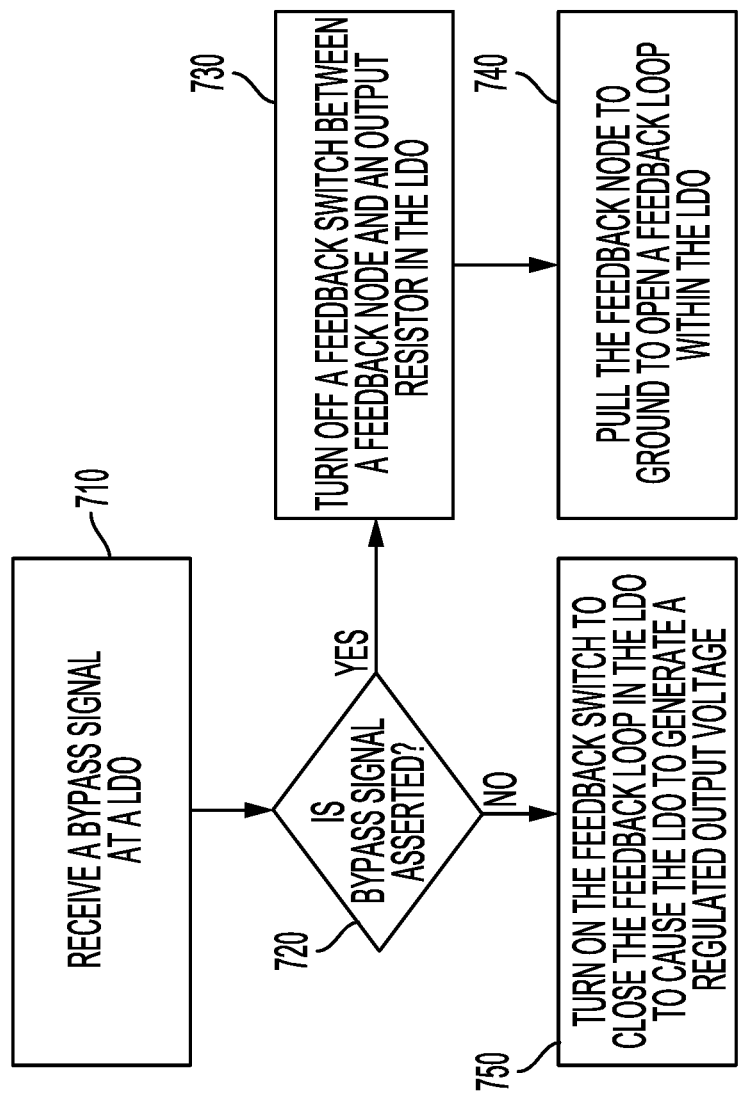
FIG. 7 shows one exemplary method of operating LDO 520 shown in FIG. 5A.

FIG. 7 shows a flow diagram of one exemplary method of operating LDO 520 shown in FIG. 5A. The method begins at block 710, where LDO 520 receives a bypass signal (e.g., bypass signal 501 in FIG. 5A). Then the method transitions to block 720 to determine if bypass signal is asserted. If bypass signal is asserted, the method transitions to block 730, where a feedback switch (e.g., feedback switch 542) between a feedback node and an output resistor in LDO 520 is turned off. Then the method transitions to block 740, in which the feedback node is pulled to ground to open (or break) a feedback loop within LDO 520. In other words, LDO 520 goes into bypass mode when bypass signal is asserted.

If it is determined that bypass signal is not asserted at block 720, then the method transitions to block 750. At block 750, the feedback switch is turned on to close the feedback loop in LDO 520 to cause LDO 520 to generate a regulated output voltage, e.g., a regulated 1.8V. In other words, LDO 520 goes into regulation mode when bypass signal is de-asserted.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A low drop-out regulator (LDO), comprising:
   a first resistor having a first terminal and a second terminal;
   a pass transistor having a source, a gate, and a drain to output a voltage Vout, the source coupled to a supply voltage, the gate coupled to an output of an operational transconductance amplifier (OTA), and the drain coupled to the first terminal of the first resistor;
   a feedback switch having a drain, a gate, and a source, the drain coupled to the second terminal of the first resistor, the source coupled to a negative input of the OTA; and
   an pull-down transistor having a drain, a gate, and a source, the source coupled to ground, the gate coupled to the gate of the feedback switch, and the drain coupled to the negative input of the OTA, wherein the gate of the pull-down transistor and the gate of the feedback switch are configured to receive a bypass signal.

2. The LDO of claim 1, further comprising:
   a second resistor having a first terminal and a second terminal, the second terminal coupled to ground and the first terminal coupled to the second terminal of the first resistor.

3. The LDO of claim 1, wherein the bypass signal is asserted when the supply voltage is at approximately 1.8V.

4. The LDO of claim 3, wherein the LDO enters a bypass mode when the bypass signal is asserted.

5. The LDO of claim 4, wherein, in response to the bypass signal being asserted, the pull-down transistor pulls the negative input of the OTA to ground.

6. The LDO of claim 1, wherein the bypass signal is de-asserted when the supply voltage is at approximately 3.3V or 5.0V.

7. The LDO of claim 6, wherein the LDO enters a regulation mode when the bypass signal is de-asserted.

8. The LDO of claim 7, wherein, in response to the bypass signal being de-asserted, the feedback switch is closed to cause the pass transistor to output a regulated voltage at approximately 1.8V.

9. The LDO of claim 1, wherein the supply voltage is within a range of approximately 5V to 1.8V.

10. The LDO of claim 1, wherein the feedback switch comprises a first p-type transistor, the pull-down transistor is an n-type transistor, and the pass transistor is a second p-type transistor.

* * * * *